US011397001B2

(12) United States Patent
Mertens et al.

(10) Patent No.: US 11,397,001 B2
(45) Date of Patent: Jul. 26, 2022

(54) LIGHTING DEVICE COMPRISING CIRCUIT BOARD

(71) Applicants: Lumileds LLC, San Jose, CA (US); Marelli Automotive Lighting Reutlingen (Germany) GmbH, Reutlingen (DE)

(72) Inventors: Juergen Mertens, Wuerselen (DE); Georg Henninger, Aachen (DE); Andreas Stang, Reutlingen (DE); Anna Harder, Reutlingen (DE)

(73) Assignees: Lumileds LLC, San Jose, CA (US); Marelli Automotive Lighting Reutlingen (Germany) GmbH, Reutlingen (DE)

( * ) Notice: Subject to any disclaimer, the term of this patent is extended or adjusted under 35 U.S.C. 154(b) by 0 days.

(21) Appl. No.: 16/563,493

(22) Filed: Sep. 6, 2019

(65) Prior Publication Data

US 2020/0080716 A1    Mar. 12, 2020

(30) Foreign Application Priority Data

Sep. 7, 2018   (EP) ..................................... 18193236

(51) Int. Cl.
*F21V 29/70*      (2015.01)
*H05K 1/11*       (2006.01)
(Continued)

(52) U.S. Cl.
CPC ........... *F21V 29/70* (2015.01); *H05K 1/0203* (2013.01); *H05K 1/111* (2013.01);
(Continued)

(58) Field of Classification Search
CPC ...... F21V 29/70; F21V 17/005; F21V 19/005; F21V 23/006; F21V 23/06; F21V 25/10;
(Continued)

(56) References Cited

U.S. PATENT DOCUMENTS

| 8,419,217 B2 * | 4/2013 | Lu ......................... F21V 29/507 |
| | | 362/249.02 |
| 8,465,175 B2 * | 6/2013 | Nall ...................... F21V 23/007 |
| | | 362/249.06 |

(Continued)

FOREIGN PATENT DOCUMENTS

| EP | 3279552 | * | 2/2018 | ................ F21S 8/10 |
| JP | 07-282921 A | | 10/1995 | |

(Continued)

OTHER PUBLICATIONS

International Search Report and Written Opinion for PCT International Application No. PCT/EP2019/072386 dated Sep. 13, 2019.

(Continued)

*Primary Examiner* — Peggy A Neils
(74) *Attorney, Agent, or Firm* — Volpe Koenig

(57) ABSTRACT

Lighting devices and methods of manufacturing lighting devices are described. A lighting devices includes at least one thermally conductive element, at least one lighting module thermally coupled to the at least one thermally conductive element, and an overmould at least partially encasing the at least one thermally conductive element, the overmould comprising at least one receiving portion. The at least one circuit board is mounted in the at least one receiving portion and is at least partially exposed from the overmould. The at least one circuit board includes at least one connector and at least two bond pads. The at least one connector includes surface accessible conduction lines.

20 Claims, 2 Drawing Sheets

(51) Int. Cl.
  *H05K 1/02* (2006.01)
  *F21Y 115/10* (2016.01)
(52) U.S. Cl.
  CPC . *F21Y 2115/10* (2016.08); *H05K 2201/10106* (2013.01); *H05K 2201/10598* (2013.01); *H05K 2201/10606* (2013.01)
(58) Field of Classification Search
  CPC .............. F21Y 2115/10; H05K 1/0203; H05K 2201/10106; H05K 2201/10598; H05K 2201/10606; H05K 2203/1316; F21S 41/192; F21S 43/195; F21S 45/47; F21K 9/90
  See application file for complete search history.

(56) References Cited

U.S. PATENT DOCUMENTS

| | | | |
|---|---|---|---|
| 9,052,104 B2 | 6/2015 | Watanabe et al. | |
| 9,157,612 B2* | 10/2015 | Alfier | F21V 29/70 |
| 9,820,356 B2 | 11/2017 | Van De Sluis et al. | |
| 9,826,594 B2 | 11/2017 | Tsuchiya et al. | |
| 9,909,743 B2* | 3/2018 | Dankelmann | F21V 21/005 |
| 10,295,128 B2* | 5/2019 | Sharrah | F21K 9/90 |
| 10,935,202 B2* | 3/2021 | Mertens | F21S 41/141 |
| 2006/0262533 A1* | 11/2006 | Lin | F21S 4/10 |
| | | | 362/249.01 |
| 2007/0177401 A1* | 8/2007 | Nakabayashi | F21S 41/148 |
| | | | 362/548 |
| 2010/0302777 A1* | 12/2010 | Knoll | F21S 45/47 |
| | | | 362/235 |
| 2012/0262906 A1* | 10/2012 | Wimbert | F21V 5/00 |
| | | | 362/92 |
| 2017/0074502 A1 | 3/2017 | Brnada et al. | |
| 2017/0347413 A1* | 11/2017 | John | H05B 31/50 |
| 2018/0087762 A1* | 3/2018 | Bukkems | F21V 29/506 |
| 2018/0252383 A1* | 9/2018 | Stefura | F21V 31/005 |
| 2019/0383463 A1* | 12/2019 | Kosugi | F21V 29/83 |
| 2019/0390830 A1* | 12/2019 | Hatanaka | F21S 43/195 |

FOREIGN PATENT DOCUMENTS

| | | |
|---|---|---|
| JP | 2007-012322 A | 1/2007 |
| JP | 2010-182487 A | 8/2010 |
| JP | 2015-176639 A | 10/2015 |
| WO | 2018/069231 A1 | 4/2018 |

OTHER PUBLICATIONS

Extended European Search Report dated Nov. 20, 2018 for European Patent Application No. 18193236.9.
Japanese Office Action dated Apr. 26, 2022 for Japanese Patent Application No. 2021-537484.

* cited by examiner

LIGHTING DEVICE COMPRISING CIRCUIT BOARD

FIELD OF INVENTION

The present disclosure relates to lighting devices comprising at least one heat sink and/or lead frame and an overmould, in particular in the area of automotive exterior or interior lighting.

BACKGROUND

Lighting devices used as automotive exterior or interior lights usually comprise an overmoulded heat sink. A lighting module is attached to the heat sink so that the heat from the operating lighting module can safely dissipate without inflicting damage to the lighting device. The lighting module attached to the heat sink is connected to an electrical interface via electrical lines connected to the lighting module, so that the lighting module can be externally controlled, in particular switched on or off.

Typically, a first mould is employed, which at least partially encases the electrical lines and in which a socket connector is formed during moulding. This first mould is then inserted into the heat sink and overmoulded in a second moulding step. However, as the connector is formed during the overmoulding, later adaptations of the connector or e.g. completely different connector shapes require an adaptation of the moulding tool used for the overmoulding. Such adaptations are costly, inflexible and hinder fast product proliferations.

An example of known overmoulding techniques is disclosed in WO 2018/069231 A1.

SUMMARY

Lighting devices from the prior art require forming a connector in an overmould and overmoulding electrical lines in a first of two separate overmoulding steps. Hence, the method for producing such a lighting device is inflexible and adaptations are costly. Also lighting devices are not easily adaptable and replaceability of components can be improved.

It is therefore an object of the present invention to provide a lighting device having a flexible design, which allows for inexpensive adaptations both in the production process and preferably also at a later stage in the life time of the lighting device. The invention further relates to a method employed in the production of a lighting device which can inexpensively be adapted for different customer needs and can improve fast product proliferations in the case of adaptations.

According to a first aspect of the present invention above object is solved, in that a lighting device is proposed, the lighting device comprising at least one heat sink and/or lead frame; at least one lighting module thermally connected with the at least one heat sink and/or lead frame; an overmould configured to at least partially encase the at least one heat sink and/or lead frame, wherein the overmould comprises at least one receiving portion configured for receiving at least one circuit board; at least one circuit board mounted in the at least one receiving portion, the at least one circuit board comprising at least two bond pads for establishing a connection, preferably an electrical connection to the at least one lighting module.

According to a second aspect of the present invention, a method for producing a lighting device, in particular the lighting device according to the first aspect, is provided, the method comprising: providing at least one heat sink and/or lead frame; overmoulding the at least one heat sink and/or lead frame, such that the at least one heat sink and/or lead frame is at least partially encased in the overmould and a mounting surface region of the at least one heat sink and/or lead frame is provided, wherein in the overmould at least one receiving portion configured for receiving at least one circuit board is formed; arranging at least one circuit board in the at least one receiving portion.

According to a third aspect of the present invention, a use of a lighting device according to the first aspect is provided to provide an automotive exterior light, automotive interior light or aerospace interior or exterior light.

Exemplary embodiments of the first, second and third aspect of the invention may have one or more of the properties described below.

A heat sink is to be understood as a passive heat exchanger that transfers the heat generated by a lighting module, e.g. an LED unit comprising at least one LED die, preferably two or three LED dies, to a gaseous or fluid medium, preferably air or a liquid coolant, wherein heat may be dissipated away from the lighting module. A heat sink may thereby allowing regulation of the lighting module's temperature at optimal levels. The heat sink is made from a thermally conductive material, preferably a metallic material. More preferably, the heat sink comprises or consists of aluminium, copper, aluminium and/or copper based alloys. For example, a block of aluminium or an aluminium alloy can be extruded in a form that has e.g. substantially an H-shaped cross section, wherein a substantially slab shaped central part is connected with two substantially slab shaped side parts arranged substantially perpendicular to the central part. A slice suitable for the amount of heat to be dissipated, e.g. with a thickness of 1 mm to 1000 mm, preferably 20 to 200 mm, can be cut from the extruded block as a heat sink.

A lead frame is usually made of an electrically and preferably thermally conductive material and serves for contacting a lighting module, in particular for contacting LED dies, and carrying signals from the lighting module to the outside or vice versa. A lead frame, hence, preferably comprises or consists of a metallic material, more preferably it comprises or consists of aluminium, copper, aluminium and/or copper based alloys.

For producing the lighting device, a mounting surface region of the at least one heat sink and/or lead frame is provided. At least for mounting, e.g. of a lighting module, the surface mounting region is accessible from the outside, i.e. during this step of the production method the mounting surface region is at least partially exposed to the outside.

At least one lighting module is connected with the at least one heat sink and/or lead frame, in particular thermally. A lighting module may for instance be a single LED die or it may be or comprise an LED unit. An LED unit may comprise at least one semiconductor element such as a p-n-junction, a diode, and/or a transistor, in particular it may comprise at least one LED die, preferably two or three LED dies. The at least one lighting module is configured to emit light towards a light-emitting side of the lighting device. The light-emitting side may represent one or more areas of or around the lighting device, wherein an object that is to be illuminated by the lighting device can be brought to the light-emitting side for illumination. The lighting module may be intended for use in a lighting application requiring intense bright light, e. g. an automotive head light. In this case a high amount of heat may be produced when generating light, so that the lighting module may reach temperatures of 135° C. and more, potentially damaging the lighting module. This heat may be dissipated away from the lighting module by means of a thermal connection to a heat sink. For instance, the lighting module is mounted, e.g. by gluing, on the heat sink using a thermally conductive material such as a thermal paste, thermal glue or thermal pad. Alternatively, the lighting module may be soldered to the heat sink. The lighting module may also be mounted on a lead frame, in particular mounted by soldering, and the lead frame may be in thermal contact with the heat sink.

An overmould is configured to at least partially encase the at least one heat sink and/or lead frame, wherein the overmould comprises at least one receiving portion configured for receiving at least one circuit board. The overmould can be made of any suitable material. Preferably the overmould comprises a suitable plastic material, such as thermally conductive and/or electrically isolating plastic material. Preferably the overmould comprises or consists of a thermoplastic material, in particular a highly temperature resistant high performance thermoplastic like e.g. polyphenylene sulfide (PPS). A plastic material can be moulded in the desired overmould shape in a very cost-effective way.

At least one receiving portion configured for receiving at least one circuit board is formed in the overmould. The receiving portion can for example be an opening in the overmould in which a circuit board can be placed or is placed. The receiving portion, in particular the opening, may comprise a contact region, in particular a contact plane on which a circuit board may be easily mounted, for instance in that a contact plane of the receiving portion corresponds (e.g. in its dimensions) to a plane of the circuit board. For receiving at least one circuit board, the receiving portion may be accessible from the outside, wherein the receiving portion is at least partially exposed to the outside during the arranging of the at least one circuit board in the at least one receiving portion of the lighting device.

The lighting device comprises at least one circuit board comprising at least two bond pads for establishing a connection to the at least one lighting module mounted in the at least one receiving portion. A circuit board may be an electrical circuit in any predefined geometrical shape. A circuit board may be box shaped or sphere shaped, having a three-dimensional system of conductive tracks on and/or in which electronic components may be mechanically supported and/or electrically connected. Preferably, the circuit board is board shaped. The circuit board may in particular be a printed circuit board (PCB). For instance, a circuit board provides an electrical connection between bond pads and an electrical interface such as a connector.

Mounting at least one circuit board having a predefined geometrical shape in the at least one receiving portion is particularly advantageous as the circuit board can easily be interchanged with another circuit board having an identical shape, which, however, can comprise completely different electronic components. For instance, the circuit board can comprise a connector for transferring signals from the outside of the lighting device to the lighting module. Such a connector can be a DIN connector such as e.g. a rectangular connector, which are generally described in DIN 41612, or circular connector, such as described in DIN 41524. However, besides these large variety of possible standard connectors, also the connector can be a custom connector, e.g. according to an internal standard by an automobile manufacturer. According to the invention such a connector shape would not need to be shaped in the overmould, i.e. formed in the overmould. Instead, a circuit board can be utilized to support a connector. The circuit board, however, may be simply mounted in the receiving portion. The same lighting device can, thus, easily be customized for different applications or customers without needing to use different moulding tools despite the vast amount of possible connectors and in particular connector shapes. This renders the lighting device particularly flexible allowing for a high degree of customization with reduced production costs.

As mounting the circuit board in the receiving portion only requires the circuit board to have a certain shape, no additional requirements exist regarding the material of the circuit board and the components that may be placed on or in the circuit board. For instance, different connector designs, multiple connectors, or additional components like thermistors for temperature measurements, bin code resistors, protecting capacitors and transient voltage suppressor diodes can be placed on and/or in the circuit board. In some embodiments, the circuit board does not comprise lighting modules, however, status LEDs or the like can also be present on the circuit board. The circuit board is in particular based on Cu-IMS, Al-IMS, CEM3, FR4 boards and/or any other suitable material.

A bond pad may be understood as an electrical contact made from electrically conductive material present on the at least one circuit board. A bond pad is, however, meant to be any measure for establishing a connection, in particular an electrical or electronic connection, to the at least one lighting module. At least two electrical contacts and, hence, two bond pads, may be present to operate the at least one lighting module. For example, a lighting module can be connected to the circuit board via a bond pad by wire or ribbon bonds produced by means of wire bonding or ribbon bonding, respectively. Preferably the lighting module is electrically connected to the at least one circuit board, in particular by ribbon or wire bonding.

In an exemplary embodiment of the invention, the overmould further comprises at least one alignment pin, preferably at least two alignment pins, wherein the at least one alignment pin is in engagement with the circuit board. By using alignment pins the at least one circuit board, the circuit may be mounted in a simple and process-reliable manner in the at least one receiving portion of the overmould, rendering adaptations of the lighting device even more cost-effective. The at least one alignment pin may cost-effectively be formed integrally with the overmould during the overmoulding of the heat sink and/or lead frame. In this case the alignment pins preferably consist of the same material as the overmould. However, it may be desirable that the at least one alignment pin consists of a different material, e. g. it can be made from metallic material and may additionally serve to dissipate heat. The circuit board may for example comprise through-holes or alignment holes in which the alignment pins are inserted or the circuit board comprises specially formed edge regions having e.g. recesses configured to receive the alignment pins, preferably in a form-locked or positive connection. The engagement of the circuit board in this exemplary embodiment e.g. only requires the circuit board to comprise suitable alignment holes or recesses, so that the circuit board can still be easily customized.

According to another exemplary embodiment of the invention, the at least one circuit board is hot stacked to the overmould, in particular via the at least one alignment pin. By means of hot stacking the at least one circuit board can easily and inexpensively be fixed to the overmould. The hot stacking generally is performed by melting the material until the circuit board is fixed. If e.g. the overmould is made from a plastic material, the plastic material may be at last partially be melted so that after re-solidification the circuit board is firmly fixed to the overmould. In particular if alignment pins made from a plastic material are provided, one or more of these can be at least partially melted, so that a firm connection between circuit board and overmould is created after re-solidification of the material. For example in hot stacking, the at least one alignment pin can be melted down from the top, in particular parts of the at least one alignment pin extending from the circuit board. If for instance the at least one alignment pin is made from overmould material, after re-solidification a thicker portion of the overmould material is formed on the open side of the at least one alignment pin, whereas the other side of the at least one alignment pin is firmly fixed to the overmould (e.g. by material connection), so that the circuit board is fixed in place and further movement of the circuit board is prevented.

In a further exemplary embodiment of the invention, the at least one circuit board is glued to the overmould.

According to another exemplary embodiment of the invention, the at least one circuit board is screwed to the overmould, preferably using self-cutting screws.

In a further exemplary embodiment of the invention, the at least one circuit board is at least partially exposed. In this embodiment the at least one circuit board is not or at least not completely encased by an overmould and/or further elements of the lighting device. It can still be easily accessed after assembling the lighting device providing a fast and simple way to adapt a produced lighting device to different customer requirements.

According to another exemplary embodiment of the invention, the at least one circuit board comprises at least one connector, wherein preferably the at least one connector and the at least two bond pads are situated on opposite sides of the circuit board connected using vias. For constructive reasons, it is often desirable to have a connector placed a side opposite of the side establishing contact to the lighting module. This allows the lighting module to be placed close to the surface of the lighting device even if large connectors are utilized, increasing the flexibility of the lighting device.

Vias serve to establish an electrical connection between one surface of a circuit board and another surface of the circuit board, e.g. vias may be copper-plated holes that function as electrical tunnels through an insulating substrate, for instance the substrate of an FR4 board.

According to another exemplary embodiment of the invention, the at least one connector is a surface structure for connecting an external connector-plug. In particular, the at least one connector is a structure of surface accessible conduction lines on one or both sides of the circuit board, in particular in combination with cut outs and/or holes and/or slits in the circuit board, for connecting an external direct connector-plug, preferably a side connector-plug, in particular a RAST direct connector-plug. For example, a standard connector system, in particular a RAST 2.5 or RAST 5 connector system can be used to connect the lighting device to an external device, e.g. a power supply and/or a light control unit of, for example, an automobile. In particular RAST 2.5 connector-plugs can e.g. be plugged both indirectly onto pin strips and also directly onto the edge of a printed circuit board.

In an exemplary embodiment of the invention, the at least one circuit board comprises at least two connectors, wherein preferably a second connector is situated on the opposite side of the circuit board than a first connector. Having two connectors on opposite sides of the circuit board allows for a very flexible configuration of the connectors. If exactly two connectors are present and placed on opposite sides of an e.g. board shaped circuit board each one of the connectors can be configured taking a maximum space on top the circuit board, so e.g. more pins of the connector can be placed in a row allowing for a particularly flat connector. The connectors may also have different functionalities such that one of the connectors can be chosen depending on the intended application.

According to another exemplary embodiment of the invention, the at least one circuit board is a printed circuit board (PCB). A printed circuit board mechanically supports and electrically connects electronic or electrical components using conductive tracks, pads and other features etched from one or more sheet layers of a conductive material e.g. copper laminated onto and/or between sheet layers of a non-conductive substrate, e.g. FR4. PCBs can be single-sided (one conductive layer), double-sided (two conductive layers on both sides of one substrate layer), or multi-layer (outer and inner layers of conductive material, alternating with layers of substrate). PCBs may be mass produced and are highly customizable, so that they represent very inexpensive and flexible circuit boards for use in the lighting device.

In a further exemplary embodiment of the invention, the lighting device comprises at least two lighting modules, wherein the at least two lighting modules are single addressable. The at least two lighting modules can then be addressed also individually. In particular if at least two LED dies are used the circuit board is required to comprise at least three bond pads, i.e. the circuit board may comprise a number of bond pads being at least one higher than the number of LED dies. If only one connector is used, hence, the connector may comprise at least one pin more than the number of LED dies used. Preferably the at least one circuit board comprises exactly one bond pad more than the number of LED dies used.

According to another exemplary embodiment of the invention, the lighting device comprises: at least two circuit boards, preferably mounted in separate receiving portions of the overmould. Two or more circuit boards allow for advanced functionalities of the lighting device and, hence, improved flexibility. For instance, a dual function high beam/low beam head light for automotive applications can be configured using two circuit boards.

In a further exemplary embodiment of the invention, the lighting device, in particular the at least one circuit board comprises: at least one thermistor, in particular at least one negative temperature coefficient thermistor (NTC) and/or at least one positive temperature coefficient thermistor (PTC) and/or at least one bin code resistor and/or at least one protecting capacitors and/or at least one transient voltage suppressor (TVS) diode. A thermistor may be used for e.g. monitoring the temperature of the at least one lighting module, so that for example a control circuit can be created, that shuts down the lighting module if a temperature is measured that could cause damage to the lighting device. Preferably the thermistor is situated in the vicinity of the at least one lighting module, e.g. in less than 10 mm, less than or 5 mm or less than 2 mm from an edge of lighting module or an LED die. The thermistors in particular face towards the inner side of the overmould.

The features and example embodiments of the invention described above may equally pertain to the different aspects according to the present invention. In particular, with the disclosure of features relating to the lighting device according to first aspect also corresponding features relating to a method for production according to the second aspect and to the use according to the third aspect are disclosed.

It is to be understood that the presentation of embodiments of the invention in this section is merely exemplary and non-limiting.

Other features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not drawn to scale and that they are merely intended to conceptually illustrate the structures and procedures described herein.

BRIEF DESCRIPTION OF THE DRAWING(S)

Examples of the invention will now be described in detail with reference to the accompanying drawing, in which.

DETAILED DESCRIPTION OF THE PREFERRED EMBODIMENT(S)

Figure 1:
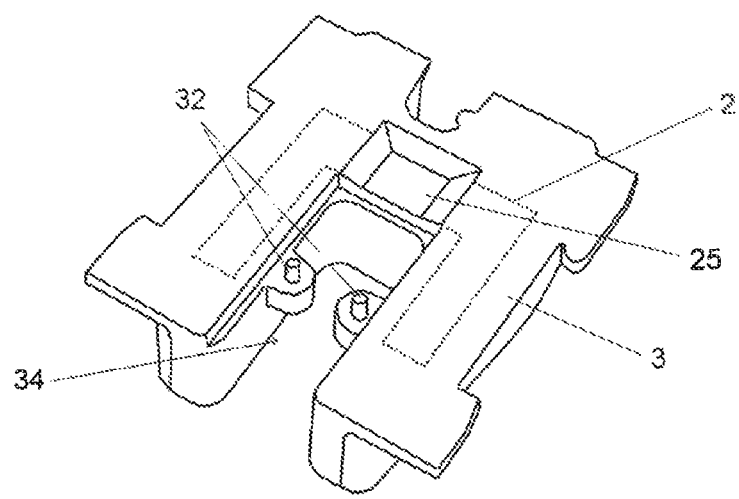
FIG. 1 shows an overmoulded heat sink for a lighting device according to the invention in a perspective view.

FIG. 1 shows an overmoulded heat sink for a lighting device 1 in a perspective view. A substantially H-shaped heat sink 2 is provided and overmoulded, so that the heat sink 2 is partially encased by an overmould 3, while a mounting surface region 25 of heat sink 2 is provided. The mounting surface region 25 is exposed and can be accessed from the outside. Two alignment pins 32 are integrally formed with the overmould 3 and a receiving portion 34 in form of an opening defining a contact plane for a printed circuit board (PCB) 4 is formed in the overmould.

Figure 2:
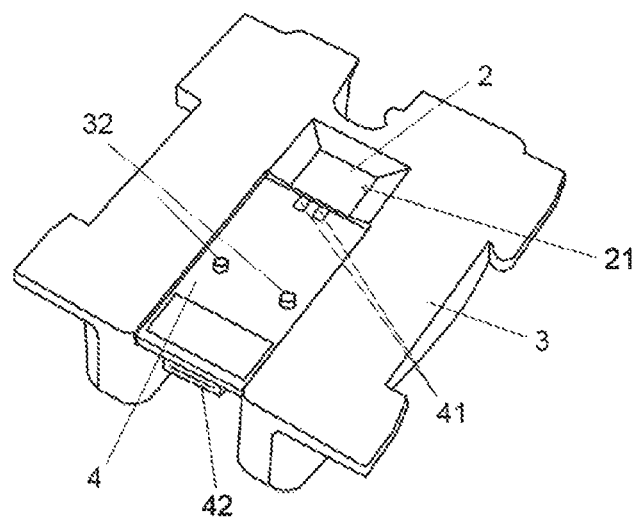
FIG. 2 shows an overmoulded heat sink with a PCB for a lighting device according to the invention in a perspective view.

FIG. 2 shows an overmoulded heat sink with a PCB 4 for a lighting device 1 in a perspective view. The PCB 4 is arranged and mounted in the receiving portion 34, wherein the two alignment pins 32 are in engagement with the PCB 4 via two suitable alignment holes of the PCB 4. The PCB 4 is partially exposed and can be accessed from the outside.

Figure 3:
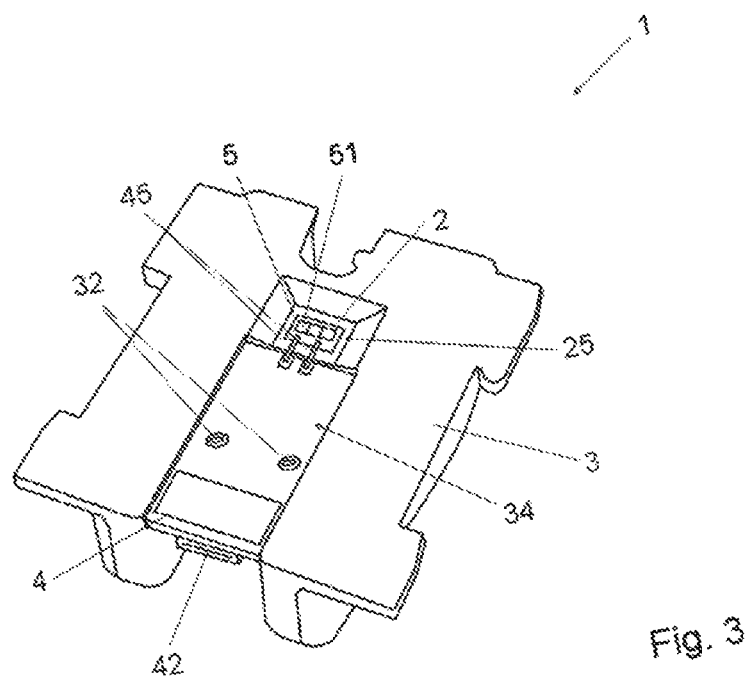
FIG. 3 shows an embodiment of a lighting device according to the invention in a perspective view.

FIG. 3 shows an embodiment of a lighting device 1 in a perspective view. The lighting device 1 comprises a substantially H-shaped heat sink 2, a lighting module 5 thermally connected with the at least one heat sink and/or lead frame, an overmould 3 configured to at least partially encase the at least one heat sink 2, wherein the overmould 3 comprises at least one receiving portion 34 configured for receiving a circuit board 4, and a circuit board 4 comprising two bond pads 41 for establishing a connection 45 to the lighting module 5 mounted in the receiving portion 34. The connection 45 is established by ribbon bonds 45. The lighting module 5 comprises three LED dies 51 and is arranged and mounted on a mounting surface portion 25 of the heat sink 2. The circuit board 4 is a PCB 4 comprising a connector 42. The PCB 4 is mounted by hot stacking in the receiving portion 34 via two alignment pins 32, integrally formed with the overmould 3, which are in engagement with the PCB 4. Due to the hot stacking, the open top portions of the alignment pins 32 are melted and re-solidified in a semi-spherical shape fixating the PCB 4 to the overmould 3.

The PCB 4 furthermore comprises a connector 42, wherein the connector 42 and the two bond pads 41 are situated on opposite sides of the PCB 4 connected using vias (not shown).

Figure 4:
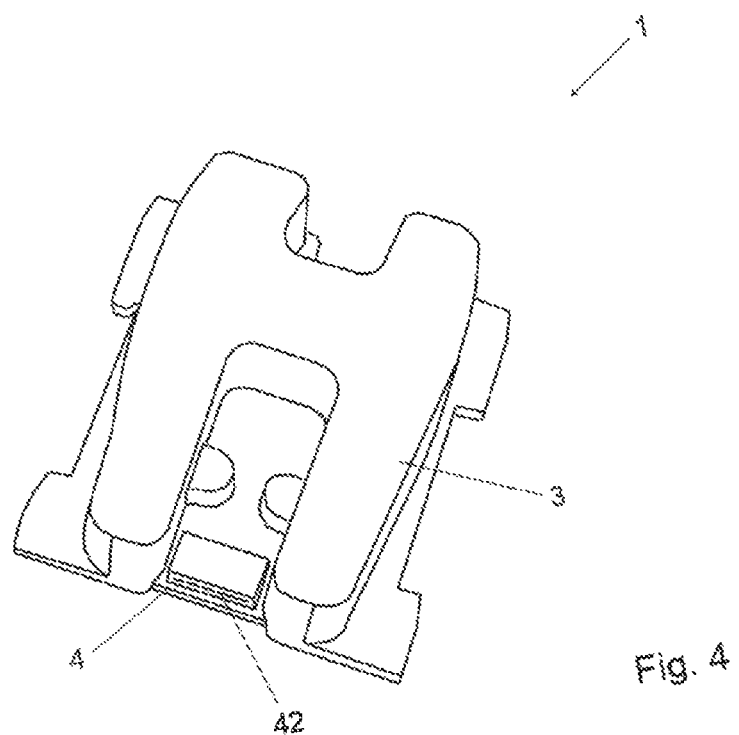
FIG. 4 shows an embodiment of a lighting device according to the invention in a perspective view.

FIG. 4 shows an embodiment of a lighting device 1 in a perspective representation from a bottom view. The connector 42 is mounted on the PCB 4, which PCB 4 is mounted in a receiving portion 34 of the overmould 3 at least partially encasing the heat sink 2.

What is claimed is:

1. A lighting device, comprising:
   a thermally conductive element;
   an overmould partially encasing the at least one thermally conductive element with at least a mounting region of the thermally conductive element exposed from the overmould, the overmould comprising at least one receiving portion;
   at least one lighting module on the mounting region of the thermally conductive element;
   at least one circuit board mounted in the at least one receiving portion and at least partially exposed from the overmould, the at least one circuit board being a separate board from the lighting module, being spaced apart from the lighting module and comprising at least one connector and at least two bond pads, the at least one connector comprising surface accessible conduction lines; and
   conductive connectors electrically coupling the at least two bond pads on the at least one circuit board to the lighting module on the mounting region of the thermally conductive element.

2. The lighting device according to claim 1, wherein the overmould comprises at least one alignment pin in engagement with the circuit board.

3. The lighting device according to claim 1, further comprising an adhesive between the at least one circuit board and the overmould.

4. The lighting device according to claim 1, further comprising at least one screw mechanically coupled to the at least one circuit board and the overmould.

5. The lighting device according to claim 1, wherein the at least one connector and the at least two bond pads are disposed on opposite sides of the circuit board, and the circuit board further comprises vias formed therein and electrically coupled between the at least one connector and the at least two bond pads.

6. The lighting device according to claim 1, further comprising openings in the circuit board configured for electrical coupling to an external direct connector-plug.

7. The lighting device according to claim 6, wherein the openings comprise at least one of cut outs, holes and slits.

8. The lighting device according to claim 1, further comprising at least two single addressable lighting modules.

9. The lighting device according to claim 1, wherein the at least one circuit board further comprises at least one of: at least one thermistor, at least one bin code resistor, at least one protecting capacitor, and at least one transient voltage suppressor diode.

10. The lighting device according to claim 9, wherein the at least one thermistor includes at least one of a negative temperature coefficient thermistor and a positive temperature coefficient thermistor.

11. The lighting device according to claim 1, wherein the at least one thermally conductive element comprises at least one of a heat sink and a lead frame.

12. A method for producing a lighting device, the method comprising:

providing at least one thermally conductive element comprising a mounting region;

arranging at least one lighting module on the mounting region of the thermally conductive element such that the at least one lighting module is thermally coupled to the at least one thermally conductive element;

overmoulding the at least one thermally conductive element such that the at least one thermally conductive element is partially encased in the overmould with the mounting region of the thermally conductive element at least partially exposed from the overmould and the overmould comprises at least one circuit board receiving portion;

arranging at least one circuit board in the at least one circuit board receiving portion, the at least one circuit board being a separate board from the lighting module, being spaced apart from the lighting module and comprising at least one connector and at least two bond pads, the at least one connector comprising surface accessible conduction lines; and electrically coupling the lighting module on the mounting region of the thermally conductive element to the at least two bond pads on the at least one circuit board using conductive connectors.

13. The method of claim 12, wherein the electrically connecting comprises one of ribbon and wire bonding the lighting module to the at least one circuit board.

14. The method according to claim 12, wherein the circuit board receiving portion comprises at least one alignment pin, and the arranging the at least one circuit board comprises arranging the at least one circuit board such that the at least one alignment pin engages the at least one circuit board.

15. The method according to claim 14, further comprising hot stacking the at least one circuit board to the overmould via the at least one alignment pin.

16. The method according to claim 12, further comprising gluing the circuit board to the overmould.

17. The method of claim 12, further comprising screwing the at least one circuit board to the overmould.

18. The method of claim 12, further comprising mounting at least one lighting module to the mounting region of the thermally conductive element.

19. The lighting device of claim 1, wherein the thermally conductive element is a substantially H-shaped thermally conductive element.

20. The lighting device of claim 19, wherein the substantially H-shaped thermally conductive element comprises two substantially parallel portions and a cross bar between the two substantially parallel portions, the mounting region comprises at least a portion of the cross bar, and the receiving portion includes portions of each of the two substantially parallel portions and the cross bar and a region partially enclosed by the two substantially parallel portions and the cross bar.

* * * * *